(12) United States Patent
Gailus et al.

(10) Patent No.: US 8,107,901 B2
(45) Date of Patent: Jan. 31, 2012

(54) FEEDBACK LOOP WITH ADJUSTABLE BANDWIDTH

(75) Inventors: Paul H. Gailus, Prospect Heights, IL (US); Manuel P. Gabato, Elmhurst, IL (US); Kevin J. McCallum, Algonquin, IL (US); Jeffrey B. Wilhite, Rolling Meadows, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 2971 days.

(21) Appl. No.: 09/933,364

(22) Filed: Aug. 20, 2001

(65) Prior Publication Data

US 2003/0038675 A1 Feb. 27, 2003

(51) Int. Cl.
*H03G 3/00* (2006.01)
*H03F 1/38* (2006.01)
*H03F 3/04* (2006.01)
*H04B 1/04* (2006.01)

(52) U.S. Cl. ........... 455/114.3; 330/282; 330/291; 330/306; 455/126; 455/127.3; 455/127.4

(58) Field of Classification Search .......... 712/220; 330/107, 129, 292, 303, 282, 291, 306; 455/126, 455/114, 127.1–127.4, 114.3; 333/134
See application file for complete search history.

(56) References Cited

U.S. PATENT DOCUMENTS

| | | | |
|---|---|---|---|
| 5,041,793 A | | 8/1991 | Gailus |
| 5,066,923 A | * | 11/1991 | Gailus et al. ............... 330/107 |
| 5,173,649 A | * | 12/1992 | Wise ............................ 318/615 |
| 5,287,556 A | * | 2/1994 | Cahill .......................... 455/266 |
| 5,420,536 A | * | 5/1995 | Faulkner et al. ............ 455/126 |
| 5,467,055 A | * | 11/1995 | Wray et al. .................. 330/129 |
| 5,508,570 A | * | 4/1996 | Laber et al. ................. 327/563 |
| 5,551,070 A | * | 8/1996 | Skarby et al. ............... 455/126 |
| 5,574,922 A | * | 11/1996 | James ........................... 712/220 |
| 5,574,992 A | | 11/1996 | Cygan et al. |
| 5,613,226 A | | 3/1997 | Kanami |
| 5,648,718 A | * | 7/1997 | Edwards ...................... 323/274 |
| 5,675,286 A | | 10/1997 | Baker et al. |
| 5,722,056 A | * | 2/1998 | Horowitz et al. ............ 455/126 |
| 5,894,496 A | * | 4/1999 | Jones ............................ 455/126 |

(Continued)

FOREIGN PATENT DOCUMENTS

WO WO 01/89081 A3 * 11/2001

OTHER PUBLICATIONS

Noise Performance of a Cartesian Loop Transmitter by Kenington et al, IEEE Transactions on Vehicular Technology, vol. 46, No. 2, May 1997, pp. 467-476.*

(Continued)

*Primary Examiner* — Lisa Hashem
(74) *Attorney, Agent, or Firm* — Nicholas C. Oros; Valerie M. Davis; Kenneth A. Haas

(57) ABSTRACT

A feedback loop with an adjustable closed loop frequency response. The feedback loop contains adjustable pole (212, 213) and adjustable zero elements (220,221) for changing the pole and/or zero locations in the feedback loop's loop frequency response thereby changing the closed loop frequency response of the feedback loop. In one embodiment, the feedback loop is a Cartesian feedback loop suitable for use in a radio transmitter.

18 Claims, 4 Drawing Sheets

U.S. PATENT DOCUMENTS

| | | | | |
|---|---|---|---|---|
| 5,933,767 | A | 8/1999 | Leizerovich et al. | |
| 6,275,685 | B1 * | 8/2001 | Wessel et al. | 455/126 |
| 6,304,156 | B1 * | 10/2001 | Ishizaki et al. | 333/134 |
| 6,556,083 | B2 * | 4/2003 | Kadanka | 330/292 |
| 6,859,097 | B2 * | 2/2005 | Chandler | 330/107 |
| 6,947,712 | B2 * | 9/2005 | Sun et al. | 455/114.3 |
| 7,016,654 | B1 * | 3/2006 | Bugeja | 455/73 |
| 7,187,911 | B2 * | 3/2007 | Arayashiki et al. | 455/126 |
| 7,248,842 | B2 * | 7/2007 | Takano et al. | 455/102 |
| 7,502,594 | B2 * | 3/2009 | Ginggen et al. | 455/69 |
| 2004/0100330 | A1 * | 5/2004 | Chandler | 330/305 |
| 2005/0265136 | A1 * | 12/2005 | Wu | 369/44.11 |
| 2006/0119444 | A1 * | 6/2006 | Horan | 331/17 |
| 2006/0217086 | A1 * | 9/2006 | Mekechuk et al. | 455/126 |
| 2008/0157874 | A1 * | 7/2008 | Lin | 330/282 |
| 2009/0042521 | A1 * | 2/2009 | Otaka et al. | 455/126 |
| 2010/0283538 | A1 * | 11/2010 | Zanchi et al. | 330/69 |
| 2011/0227642 | A1 * | 9/2011 | Hoyerby et al. | 330/109 |

OTHER PUBLICATIONS

M. Boloorian, J.P. McGeehan and R.J. Wilkinson, *Dynamic Performance Evaluation of the Cartesian Feedback Linear Transmitter*, Centre for Communications Research, University of Bristol, Queen's, Building, University Walk, Bristol, U.K. 1994, The Institution of Electrical Engineers, Published by the IEEE, Savory Place, London, UK.

Mats Johansson and Thomas Mattsson, *Transmitter Linearization using Cartesian Feedback for Linear TDMA Modulation*, Department of Applied Electronics, Lund University, S-221 00 LUND, Sweden, 1991, IEEE.

Peter B. Kennington, Ross J. Wilkinson and Kieran J. Parsons, *Noise Performance of a Cartesian Loop Transmitter*, IEEE Transactions on Vehicular Technology, vol. 46, No. 2, May 1997.

Thomas Lee, *The Design of CMOS Radio Frequency Integrated Circuits*, Cambridge University Press, 1998.

* cited by examiner

FEEDBACK LOOP WITH ADJUSTABLE BANDWIDTH

FIELD OF THE INVENTION

This invention relates generally to feedback loops and more specifically to feedback loops having adjustable bandwidth.

BACKGROUND OF THE INVENTION

Radio communication devices transmit radio frequency (RF) communication signals using an antenna. The transmitter of a radio communication device includes a power amplifier to amplify the communication signals before they are coupled to the antenna. For portable radio communication devices that are powered by a battery, operating the power amplifier at high efficiency is important to allow the communication device to operate for long periods of time. However, when most RF power amplifiers are operated in their most efficient manner, they provide non-linear amplification. This means that a change in the amplitude of the signal sent into the power amplifier results in a non-proportional change in the amplitude of the signal out of the amplifier. For constant envelope radio frequency communication techniques such as frequency modulation (FM) this is not a problem but for other modulation techniques such as quadrature amplitude modulation (QAM) non-linearity in the output of the power amplifier output is not acceptable.

One method for linearizing the output of a power amplifier is to use a Cartesian feedback loop such as the one shown in FIG. 1. The use of a Cartesian feedback loop for linearization is described in "Transmitter Linearization Using Cartesian Feedback For Linear TDMA Modulation" by M. Johansson and T. Mattson as published in the proceedings of the $41^{st}$ Vehicular Technology Conference, May 1991, pages 439-444. The loop of FIG. 1 contains a summer 103, a loop filter 105, a first mixer 107, a power amplifier 113, a radio frequency coupler 115 and a second mixer 119. The portion of the loop containing the loop filter 105, mixer 107 and power amplifier 113 is referred to as the forward path of the loop and the portion of the loop containing the radio frequency coupler 115 and second mixer 119 is referred to as the feedback path of the loop. The signal from the feedback path is subtracted from the communication signal to be transmitted, $x_i(t)$, in the summer 103. The signal out of the summer 103 passes through the loop filter 105 and into the first mixer 107 where it is modulated up to radio frequency by multiplication by the output of a oscillator 109. The first mixer 107 output is then amplified by the power amplifier 113 and the resulting signal is sent to an antenna 117. The radio frequency coupler 115 retrieves a portion of the signal coming out of the power amplifier 113 and passes it to the second mixer 119. The second mixer demodulates the signal back down to baseband by multiplying it with the output of the oscillator 109 after it has been phase adjusted.

Cartesian feedback loops can be characterized by a number of different types of frequency responses. The forward frequency response, $a(j\omega)$, is the frequency response of the forward path of the feedback loop and the feedback frequency response, $b(j\omega)$, is the frequency response of the feedback path of the feedback loop. The loop frequency response, $a(j\omega)*b(j\omega)$, is the product of the forward and feedback frequency responses. FIG. 8 shows an example of a loop frequency response of a Cartesian feedback loop. The loop frequency response, $a(j\omega)*b(j\omega)$, is made up of a gain response 805 and a phase response 809. The gain response 805 of the loop frequency response is also called the loop gain. Vertical axis 815 corresponds to the gain response 805 and is in decibels while vertical axis 820 corresponds to the phase response 809 and is in degrees. Horizontal axis 822 represents the logarithm of frequency. At a particular frequency, the amount of distortion that a Cartesian feedback loop can correct is less than or equal to the magnitude of loop gain.

A Cartesian feedback loop can also characterized by its loop bandwidth, phase margin and gain margin. Loop bandwidth 825 is defined as the frequency at which the gain response 805 of the loop frequency response equals 0 dB. Generally, in a feedback loop at frequencies less than the loop bandwidth, the magnitude of the forward frequency response $|a(j\omega)|$ is much greater than the magnitude of the feedback frequency response $|b(j\omega)|$. Phase margin 830 is defined as 180 degrees minus the absolute value of the phase response 809 of the loop frequency response at the frequency where the loop gain is 0 dB. Gain margin 835 is defined as the negative of the gain response 805 of the loop frequency response at the frequency where the phase response 809 is −180 degrees.

One important consideration of Cartesian feedback loop design is stability. Generally, there are two criteria for stability of a Cartesian feedback loop. First, the gain margin must be greater than 0 dB. Secondly, the phase margin must be positive. A more detailed discussion of stability of Cartesian feedback loops can be found in "The Design of CMOS Radio Frequency Integrated Circuits" by Thomas Lee, Cambridge University Press, 1998. Another important consideration of Cartesian feedback loop design is noise performance. Generally, noise performance of Cartesian feedback loops can be improved by keeping the loop bandwidth small. Of course, the loop bandwidth must still be made large enough to pass the communication signal being transmitted. A more detailed discussion of noise considerations in Cartesian feedback loops can be found in "Noise Performance of a Cartesian Loop Transmitter" by Peter B. Kennington, Ross J. Wilkinson and Kieran J. Parsons as published in the IEEE Transactions on Vehicular Technology, Vol. 46, No. 2, May 1997.

The loop bandwidth, phase margin, gain margin and maximum loop gain are functions of the loop filter and gain of the amplifiers in the Cartesian feedback loop. The components of the feedback loop are chosen to make the loop bandwidth large enough to pass the communication signal but small enough to attenuate noise while maintaining stability and providing a large maximum loop gain.

Oftentimes, the components of the Cartesian feedback loop except for the power amplifier and large capacitors associated with the loop filter are implemented in an integrated circuit. Generally, the implementation of the feedback loop in an integrated circuit allows the size and cost of the radio communication device to be reduced relative to circuit designs not employing an integrated circuit. Nevertheless, while it is relatively inexpensive to produce an integrated circuit once it has been designed, the design of an integrated circuit containing a Cartesian feedback loop is a time consuming and expensive process. Also, the cost of producing an integrated circuit is in general inversely proportional to the volume of the integrated circuit produced. Hence it is desirable to use a particular integrated circuit in as many radios as possible to reduce the cost of the integrated circuit by increasing the number produced.

There are many different types of radio communication devices in use today. These types include for example, global system for mobile communication (GSM) radios, code division multiple access (CDMA) radios, IS136 radios, integrated dispatch enhanced network (IDEN) radios and terrestrial trunked radio (TETRA). Generally, each of these different types of radios requires a different loop bandwidth and hence a different design for the Cartesian feedback loop. Dual mode radio communication devices that can function as multiple types of radio communication devices are becoming more common. For example, one radio communication device may function as both a GSM and an IDEN radio communication device. It would be desirable to implement Cartesian feedback loops in such radio communication devices without the need for additional parts.

BRIEF DESCRIPTION OF THE DRAWINGS

The foregoing and other advantages of the invention will become apparent upon reading the following detailed description and upon reference to the drawings in which.

DESCRIPTION OF A PREFERRED EMBODIMENT

The following describes a feedback loop that has an adjustable frequency response. The adjustable frequency response is implemented by placing elements in the forward path of the feedback loop to implement an adjustable pole and zero in the loop frequency response of the feedback loop. The adjustable pole and zero can be used to adjust the frequency response of the feedback loop by moving the pole and zero location in the loop frequency response.

Figure 1:
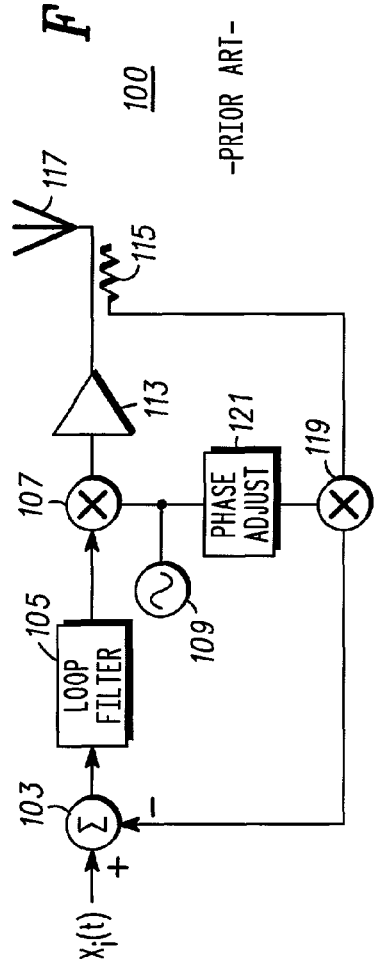
FIG. 1 is a diagram of a prior art Cartesian feedback loop.
Figure 2:
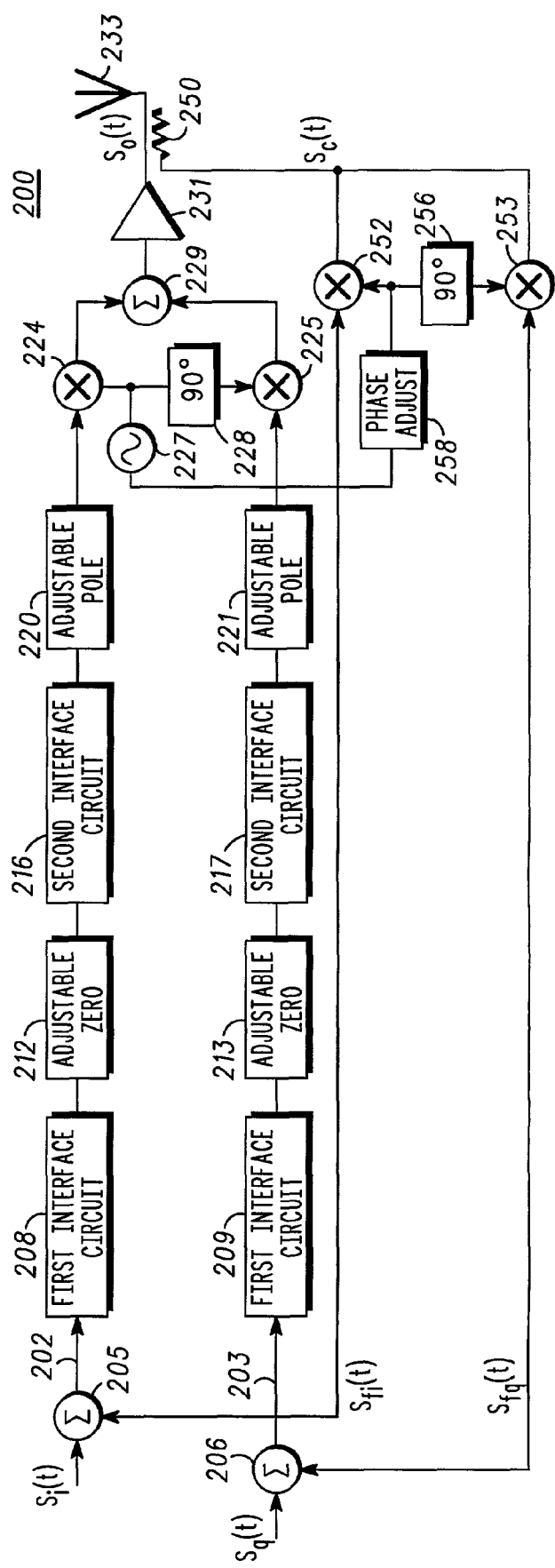
FIG. 2 is a diagram of a Cartesian feedback loop having an adjustable loop bandwidth according to one embodiment of the present invention.

FIG. 2 shows a Cartesian feedback loop with an adjustable pole and zero for linearizing the output of a non-linear power amplifier according to one embodiment of the present invention. The input signal to the Cartesian feedback loop is a complex baseband signal comprising an in-phase component signal, $S_i(t)$, and a quadrature component signal, $S_q(t)$. The output signal of the Cartesian feedback loop is a radio frequency signal, $S_o(t)$, suitable for transmission over a radio channel. The output signal $S_o(t)$ is linearized so that a change in the amplitude of the input signal results in a proportional change in the amplitude of the output signal, $S_o(t)$. The Cartesian feedback loop includes three summers 205, 206, 229, two first interface circuits 208, 209, two adjustable zero elements 212, 213, a pair of second interface circuits 216, 217, two adjustable pole elements 220, 221, a power amplifier (PA) 231, an antenna 233, a radio frequency coupler 250, an oscillator 227 and a phase adjustor 258. The Cartesian feedback loop consists of two signal paths. The portion of the feedback loop from the entry of the input signal 202, 203 into the feedback loop to the antenna 233 is referred to as the forward path of the feedback loop. The portion of the feedback loop from the radio frequency coupler 250 to the pair of summers 205, 206 with the input signal is referred to as the feedback path.

The Cartesian feedback loop 200 is referred to as Cartesian because it operates on a complex input signal. The forward path of the Cartesian feedback loop 200 contains an in-phase signal path 202 and a quadrature signal path 203. The signals in these two paths undergo parallel operations until they are added together at the summer 229. In the in-phase signal path 202, first, the in-phase component of the signal from the feedback path, $S_{fi}(t)$, is subtracted from the in-phase component of the input signal, $S_1(t)$, at the summer 205. The signal out of the summer 205 is then sent into the first interface circuit 208. In one embodiment of the present invention the first interface circuit 208 amplifies the signal from the summer 205. It will be appreciated that in other embodiments the first interface circuit 208 may perform other functions. The signal out of the first interface circuit 208 is then sent into the adjustable zero element 212. The adjustable zero element 212 along with the adjustable pole element 220 provides a means for changing the frequency response of the feedback loop so that the bandwidth of the loop can be changed in a manner that retains loop stability.

Figure 3:
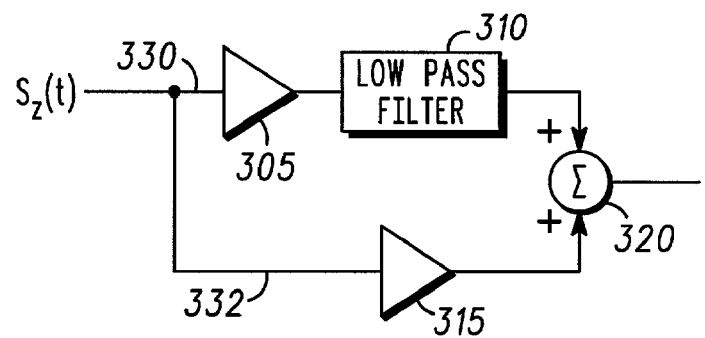
FIG. 3 is a diagram of an adjustable zero circuit of the Cartesian feedback loop of FIG. 2.

FIG. 3 shows a more detailed diagram of the adjustable zero element 212. The adjustable zero element 212 comprises an adjustable amplifier 305, a low pass filter 310, an amplifier 315 and a summer 320. The signal into the adjustable zero element 212, $S_z(t)$ is split into a first signal path 330 and a second signal path 332. The first signal path 330 leads to the adjustable amplifier 305. The output of the adjustable amplifier 305 is next passed into the low pass filter 310. As is well known, the low pass filter 310 attenuates the higher frequency components of the input signal. The second signal path 332 leads into the amplifier 315. The outputs of the low pass filter 310 and amplifier 315 are sent to the summer 320 where they are added together and sent out of the adjustable zero element 212. The design and implementation of adjustable amplifier circuits, low pass filters, summers and amplifiers are well known and will not be described in detail herein.

Figure 4:
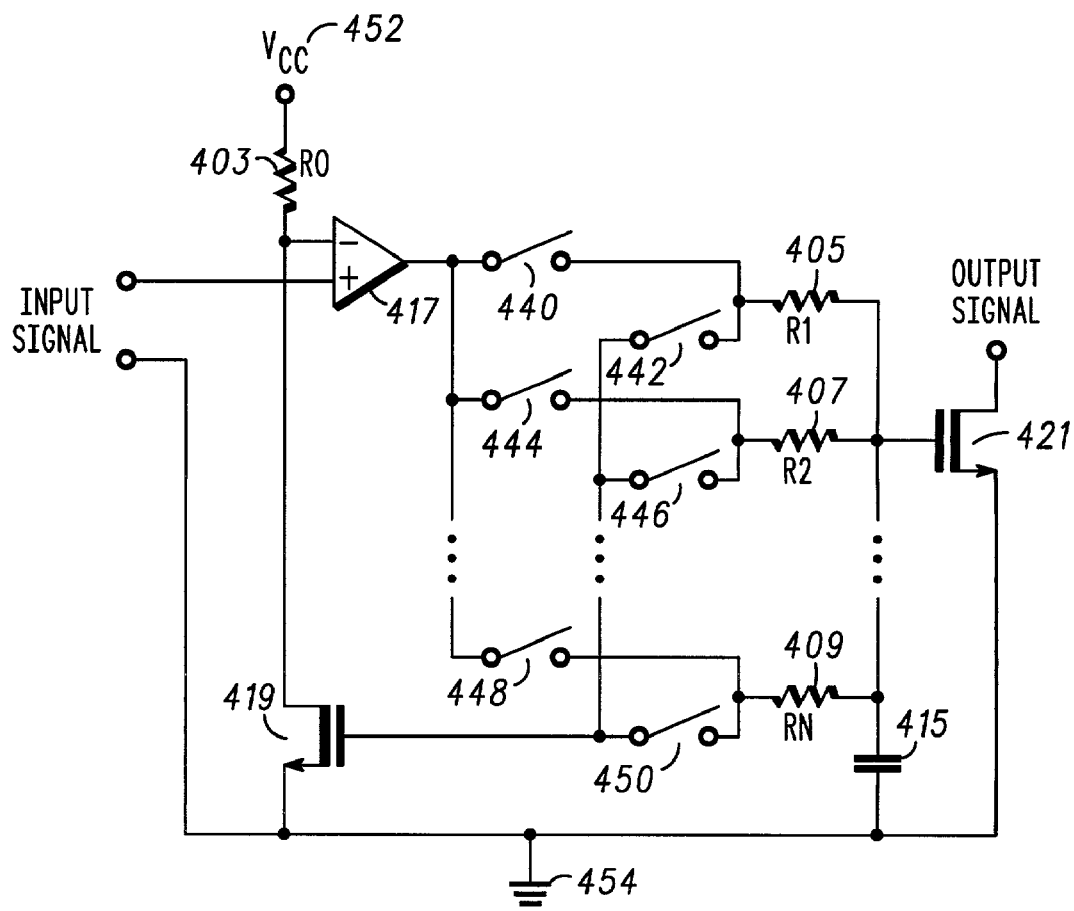
FIG. 4 is a diagram of a circuit that is used to implement an adjustable pole circuit of the Cartesian feedback loop of FIG. 2.

Returning to FIG. 2, the signal out of the adjustable zero element 212 enters the second interface circuit 216. In one implementation of the present invention, the second interface circuit 216 provides signal amplification and isolation buffering. The output of the second interface circuit 216 is sent into the adjustable pole element 220. FIG. 4 shows the adjustable pole element 220 according to one embodiment of the present invention. The adjustable pole element 220 is a RC low pass filter circuit that uses a set of switchable resistors to change its cutoff frequency. The adjustable pole element 220 includes numerous resistors 403-409, a capacitor 415, an operational amplifier 417, and two field effect transistors (FET) 419, 421. The signal into the adjustable pole element is placed between an input of the operation amplifier 417 and circuit ground 454. The other input to the operational amplifier 417 is connected to the FET 419 and a DC voltage source $V_{cc}$ 452 across the resistor 403. The output of the operational amplifier 417 is connected to switches 440, 444, 448. Other switches 442, 446, 450 are connected to the FET 419. Each of the switches 440-450 is also connected to one of the resistors 405-409. The switches open and close in pairs with each pair of switches connected to only one of the resistors 405-409. For example, the switches 440 and 442 that are connected to the resistor 405 are paired, the switches 444 and 446 that are connected to resister 407 are paired and the switches 448 and 450 that are connected to resistor 409 are paired. Only one of the pairs of switches is closed at any time. The capacitor 415 is connected between the resistors 405-409 and the circuit ground 454. The resistor is also connected to the FET 421. The output signal from the adjustable pole element is taken from a drain terminal of the FET 421.

Returning again to FIG. 2, the output signal from the adjustable pole element 220 is sent into the mixer 224. The mixer multiplies the signal from the adjustable pole element 220 by a sinusoidal signal supplied by the oscillator 227. The resulting radio frequency signal is then sent into a summer where it is added to the signal from the quadrature signal path. The quadrature signal path performs all of the same operations on the quadrature component of the input signal, $S_q(t)$, as the in-phase signal path performs on the in-phase component of the input signal, Si(t). That is the quadrature part of the signal from the feedback path, $S_{fq}(t)$, is subtracted from the quadrature part of the input signal $S_q(t)$. The resulting signal is then passed through the first interface circuit 209, the adjustable zero element 213, the second interface circuit 217 and the adjustable pole element 221 before being sent to the mixer 225. The adjustable zero element 213 and adjustable pole element 221 of the quadrature signal path 203 are substantially identical to the adjustable zero element 212 and adjustable pole element 220 of the in-phase signal path 202. The mixer 225 multiplies the quadrature path signal from the adjustable pole element 221 by a sinusoidal signal from the oscillator 227 that has passed though a 90 degree phase shifter 228. After the signals from the in-phase and quadrature signal paths have been added together in the summer 229, the resulting signal is amplified by a power amplifier 231 to produce the output signal $S_o(t)$ that is transmitted using the antenna 233.

The radio frequency coupler 250 retrieves a portion of the output signal $S_o(t)$ of the Cartesian feedback loop. The signal from the radio frequency coupler 250, $S_c(t)$, is fed to two mixers 252, 253 to change the signal from a radio frequency signal to a baseband signal with in-phase and quadrature components. This is accomplished by multiplying the signal $S_c(t)$ by a phase adjusted version of the sinusoidal signal from the oscillator 227. The sinusoidal signal from the oscillator 227 is sent into a phase adjustment circuit 258. The phase adjustment circuit 258 shifts the phase of the sinusoidal signal to match the phase of the signal from the radio frequency coupler 250, $S_c(t)$. The phase adjusted sinusoidal signal is then directly sent to one of the mixers 252 and sent to the other mixer 253 via a 90 degree phase adjustment circuit 256. The mixers 252, 253 output a feedback signal that is a baseband version of the signal from the radio frequency coupler 250. The feedback signal is a complex signal consisting of two components: an in-phase component, $S_{fi}(t)$, and a quadrature component $S_{fq}(t)$. These signals are subtracted from the in-phase and quadrature components of the input signal $S_i(t)$, $S_q(t)$ by the summers 205, 206.

One way of describing the operation of a circuit is by use of a frequency response plot. A frequency response plot or transfer function shows how the ratio of the output signal magnitude to input signal magnitude varies as a function of frequency as well as the phase relationship between the output signal and input signal as a function of frequency. There are two kinds of frequency responses that are commonly used to characterize feedback loops: a loop frequency response and a closed loop frequency response. The loop frequency response is the frequency response of the elements in both the feedback and forward paths of the feedback loop. The closed loop frequency response is the transfer function between the input signal and output signal of the feedback loop. The closed loop frequency response shows how an input signal is affected by the feedback loop and is often referred to simply as the frequency response of the feedback loop. As is well known, the frequency response of a circuit is in a large part determined by the locations of the poles and zeros of the circuit in frequency. A pole causes a 20 dB per decade decrease in the slope of the frequency response curve and a zero causes a 20 dB per decade increase in the slope of the frequency response when the frequency response is plotted on a logarithmic frequency scale. A decade of frequency refers to a change in frequency by a factor of ten.

The adjustable pole elements 220, 221 and adjustable zero elements 212, 213 of the Cartesian feedback loop 200 are used to change the locations of a pole and zero in the loop frequency response of the Cartesian feedback loop 200. The changing of the pole and zero locations can be done, for example, to change the closed loop bandwidth to allow a different bandwidth input signal, to adjust the stability properties of the feedback loop by changing the gain margin and/or phase margin, or to change the noise performance of the loop. Although there are two adjustable pole elements 220, 221 it should be noted that there is only one adjustable pole in the loop frequency response of the Cartesian feedback loop 200. This is because each of the two adjustable pole elements 220, 221 acts on one component of a complex signal (i.e. either the in-phase or quadrature signal path). The two adjustable pole elements 220, 221 switch in identical resistors 405-409 so that that both signal paths 202, 203 are affected in the same way. Similarly, the two adjustable zero elements 212, 213 place only one adjustable zero in the loop frequency response of the Cartesian feedback loop 200. The adjustable amplifier 305 is set to provide the same amount of gain in both of the adjustable zero elements 212, 213.

Figure 5:
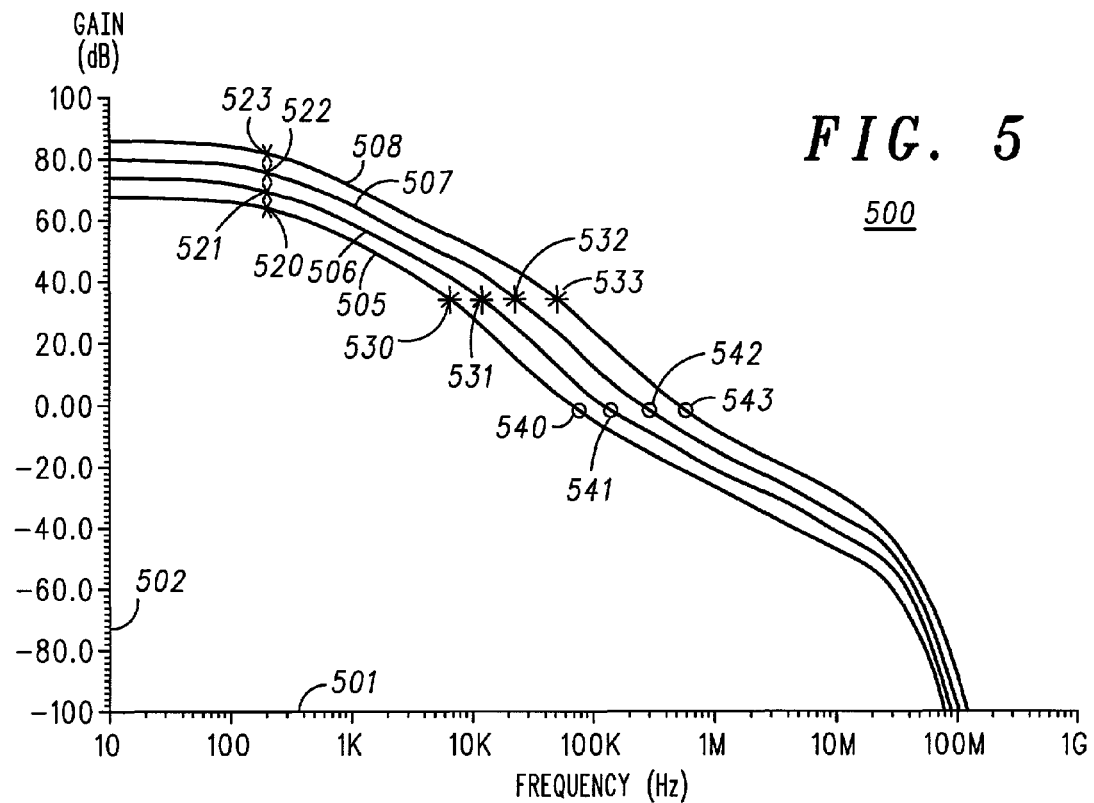
FIG. 5 is a loop frequency response of the Cartesian feedback loop of FIG. 2 for four different locations of an adjustable pole and zero.

FIG. 5 shows four loop frequency response curves 505-508 for the Cartesian feedback loop 200 of FIG. 2 for four different locations of the adjustable pole and adjustable zero. The loop frequency response is shown shifted to baseband so that a logarithmic scale can be used for the frequency axis. It should be noted that if the loop frequency response was not shifted to baseband, it would appear as a bandpass filter centered around the frequency of the sinusoidal signal from the oscillator 227. The locations of a zero and two poles are shown on each of the frequency response curves 505-508. The first pole 520-523 is shown on each curve by a 'X', the second pole 530-533 is shown on each curve by a '*' and the zero is shown on each curve by 'o'. The effect of the poles and zeros on the loop frequency response can be seen by examining the first frequency response curve 505. The first curve 505 starts out at a constant amplitude of 68.5 dB for low frequencies. The gain begins to fall off at 20 dB per decade at the first pole 520. The gain falls off at an even faster rate of 40 dB per decade after the second pole 530. After the zero 540 the slope of the curve 505 levels out by 20 dB per decade.

Each of the four curves 505-508 represents the loop frequency response of the Cartesian feedback loop 200 with different locations of the adjustable poles and zeros. The locations of the adjustable poles and zeros are determined by the adjustable pole 220, 221 and adjustable zero 212, 213 elements. The first pole 520-523 of each of the curves is at the same location in frequency since it is not adjustable. The location of the first pole is determined by the low pass filter 310 of FIG. 3. For purposes of the curves of FIG. 5, the low pass filter circuit comprises a 40 kohm resistor in series with a 20 nF capacitor. The frequency location of the second pole 530-533 of each of the curves is determined by which of the resistors 405-409 is coupled into the adjustable pole elements 220, 221. The frequency location of the zero 540-543 is determined by the gain of the adjustable amplifier 305 in the adjustable zero elements 212, 213. Table 1 summarizes the resistor values coupled into the adjustable pole elements 220, 221 and the gain of the adjustable amplifier 305 in the adjustable zero elements 212, 213 for each of the four loop frequency response curves of FIG. 5. The capacitor 415 in the adjustable pole elements 220, 221 was set to 1 nF and the gain of the amplifier 315 in the adjustable zero elements 212, 213 was 32 dB.

TABLE 1

| Loop Frequency Response Curve Number (FIG. 5) | Closed Loop Frequency Response Curve Number (FIG. 6) | Adj. Pole Coupled Resistor (kohms) | Adj. Zero Circuit Adj. Amp 305 Gain (dB) | Adj. Zero Baseband Location (kHz) |
|---|---|---|---|---|
| 505 | 610 | 25 | 5 | 62.5 |
| 506 | 611 | 12.5 | 11 | 125 |
| 507 | 612 | 6.4 | 17 | 250 |
| 508 | 613 | 3.2 | 23 | 500 |

Figure 6:
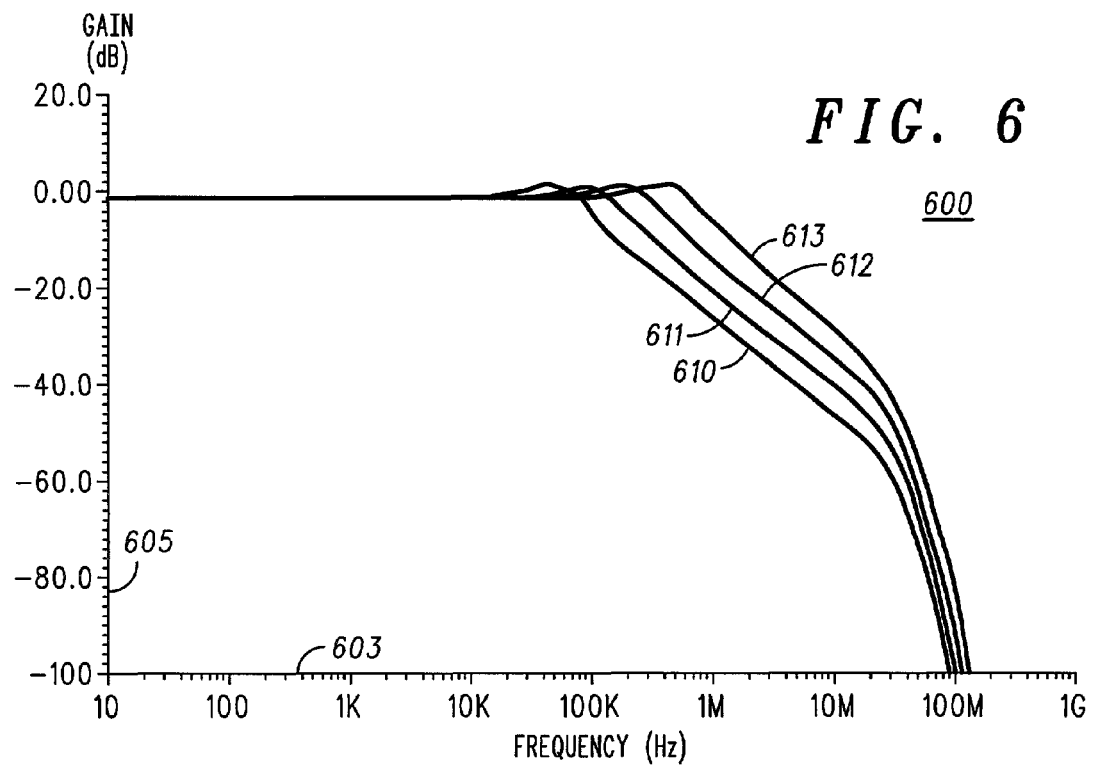
FIG. 6 is a closed loop frequency response of the Cartesian feedback loop of FIG. 2 for four different locations of an adjustable pole and zero.

FIG. 6 shows the closed loop frequency response of the Cartesian feedback loop 200 for the same four adjustable pole and zero locations as in the loop frequency response of FIG. 5. As with the frequency response curves of FIG. 5, the closed loop frequency responses have been shifted to baseband in FIG. 6 so that they can be plotted on a logarithmic frequency scale. Each of the frequency response curves 610-613 has a constant gain for low frequencies and then rapidly decreases for higher frequencies. The range of frequencies for which the gain remains constant is the bandwidth of the closed loop frequency response. As is usually the case for feedback loops, the low frequency constant gain portion of the closed loop frequency response curves 610-613 extends over a much larger range of frequencies than for the loop frequency response curves. Four closed loop frequency response curves 610-613 are shown corresponding to the four loop frequency response curves 505-508 respectively. FIG. 6 illustrates that the bandwidth of the closed loop frequency response curves 610-613 is related to the locations of the adjustable poles and zeros in the loop frequency response curves. The higher the frequency of the adjustable poles and zeros, the greater the bandwidth of the closed loop frequency response. It should be noted that the bandwidth of the closed loop frequency response is also known as the closed loop bandwidth or simply bandwidth of the feedback loop.

According to one embodiment of the present invention, substantially all of the elements of the Cartesian feedback loop 200 of FIG. 2 are implemented within an integrated circuit. The only elements not contained within the integrated circuit are oscillator 227 and capacitors such as the capacitors 415 in the adjustable pole elements 220, 221 and capacitors within other parts of the Cartesian feedback loop 200 such as in the low pass filter 310 or first and second interface circuits 208, 209, 216, 217. The implementation of substantially all of the Cartesian feedback loop 200 within an integrated circuit allows for a much lower cost than if the elements of the Cartesian feedback loop 200 were spread over several integrated circuits or not within an integrated circuit. The bandwidth flexibility due to the adjustable pole and zero allows the integrated circuit to be used in different kinds of radio transmitters or be used in radio transmitter that transmits signals with different bandwidths. For example, such an integrated circuit could be used in a radio capable of transmitting IDEN, CDMA and GSM signals. Of course it will be appreciated that in other embodiments of the present invention, the oscillator and/or one or more of the capacitors may also be implemented within the integrated circuit.

As will be appreciated by those skilled in the art, many variations of the Cartesian feedback loop 200 exist that are within the spirit and scope of the present invention. For example, the order of the elements in the forward path such as the first interface circuit, 208, 209, adjustable zero elements 212, 213, second interface circuit 216, 217, adjustable pole elements 220, 221 and mixers 224, 225 can be changed. The first interface circuits 208, 209 and second interface circuits 216, 217 can perform other functions than those listed. The adjustable pole 220, 221 circuit can be implemented in ways other than the circuit shown in FIG. 4. For example, the circuit could have switchable capacitors instead of switchable resistors, both switchable resistors and switchable capacitors, transistor circuits other than FETs could be employed, or the operational amplifier 417 could be removed. The adjustable zero element 212, 213 could be implemented in other ways than the circuit shown in FIG. 3. For example, the adjustable amplifier 305 could be replaced by a group of parallel fixed gain amplifiers that are switched into the circuit in a manner similar to the switched resistors of FIG. 4, the amplifier 315 could have an adjustable gain or the low pass filter 310 may be replaced by a more complicated circuit or removed. The feedback path could have additional elements that perform functions such as filtering and amplification. The Cartesian feedback loop may contain only the adjustable pole elements 220, 221 or the adjustable zero elements 212, 213 instead of both adjustable pole 220, 221 and adjustable zero elements 212, 213. The circuit may have only the in-phase signal path 202 instead of both the in-phase 202 and the quadrature signal path 203 in the forward and reverse signal paths (and hence be just a feedback loop instead of a Cartesian feedback loop). The amplifier 315 of FIG. 3 may be replaced by an adjustable amplifier that has a variable gain. The location of the phase adjustment circuit 258 may be changed or the phase adjustment circuit 258 may be absent from the Cartesian feedback loop 200. As will be appreciated many other variations of the Cartesian feedback loop 200 are possible.

Figure 7:
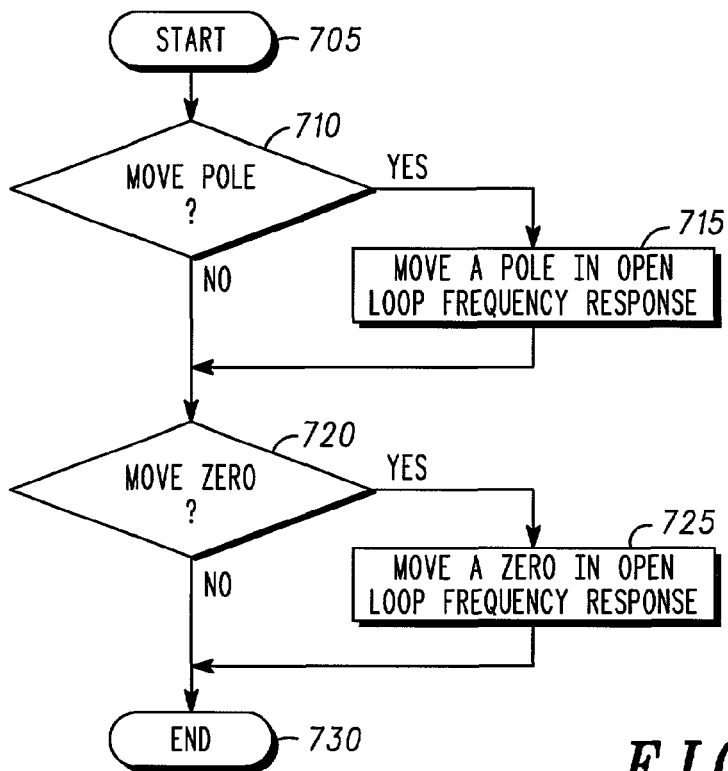
FIG. 7 is a flow chart illustrating a method for changing the closed loop frequency response of a feedback loop according to an embodiment of the present invention.
Figure 8:
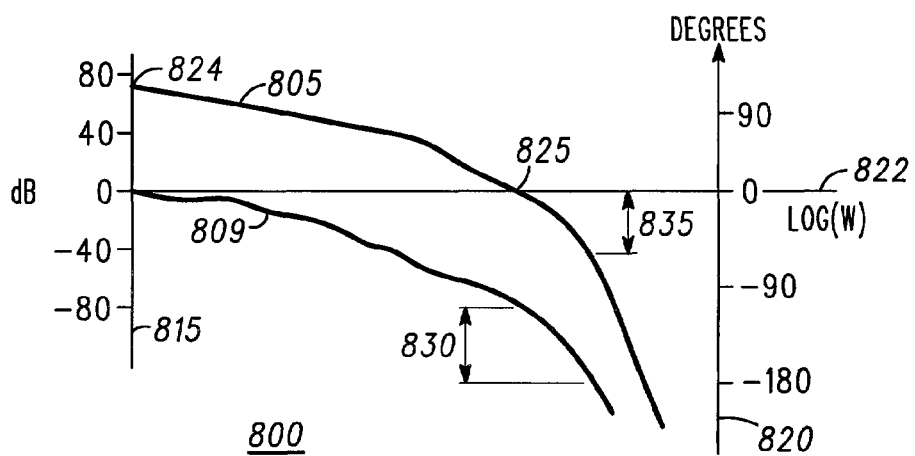
FIG. 8 is a diagram of an example loop frequency response of a prior art Cartesian feedback loop.

FIG. 7 shows a flow chart illustrating a method for changing the frequency response of a feedback loop according to an embodiment of the present invention. The flow chart starts at step 705 and proceeds to step 710 where a decision is made about whether a pole in the loop frequency response of the feedback loop will be moved. As previously described, a pole in the loop frequency response will cause a 20 dB per decade decrease in the slope of the loop frequency response curve so this decision will depend on the desired shape of the loop frequency response curve. This decision may be driven, for example, by a desire to change the closed loop bandwidth or to adjust the stability characteristics of the feedback loop. If the answer is yes at step 710, at step 715 the pole in the loop frequency response is moved. This can be accomplished by switching among a plurality of elements having different impedances such as the resistors 405-409 of FIG. 4. The movement of the pole yields a change in the closed loop frequency response and/or loop frequency response of the feedback loop. Next, at step 720 a decision is made about whether a zero in the loop frequency response will be moved. Since a zero results in a 20 dB per decade shift increase in the slope of the loop frequency response this decision will also depend on the desired shape of the loop frequency response. If the answer is yes at step 720, at step 725 the zero in the loop frequency response is moved at step 720. This can be accomplished by adjusting an amplifier with a variable gain such as the adjustable amplifier 305 of FIG. 3. The movement of the zero yields a change in the closed loop frequency response or loop frequency response of the feedback loop. The method then ends at step 720.

As will be appreciated, feedback loops can be used in a wide variety of circuits other than Cartesian feedback loops for use in radio transmitters. By way of example and not by way of limitation, feedback loops can be used in amplifiers, oscillators, phase lock loops, feedback demodulators and numerous types of control systems. The utility of these feedback loops would be enhanced by having an adjustable closed loop frequency response bandwidth. Hence alternate embodiments of the present invention include feedback loops adapted for these purposes.

The present invention thereby provides a means for the frequency response of feedback circuits to be adjusted. This allows the circuits to be used in a wider variety of situations. The adjustment of the frequency response is accomplished by inclusion of adjustable pole and/or zero elements in the closed loop frequency response of the feedback loop.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. In an electrical device generating a variable output signal, a feedback loop for adjusting the variable output signal, the feedback loop having an input for receiving an input signal, an output for outputting the variable output signal and a loop bandwidth associated with a forward path and a feedback path of the feedback loop, the feedback loop comprising:
    a power amplifier coupled to the output of the feedback loop in the forward path of the feedback loop;
    at least one adjustable zero element coupled between the input of the feedback loop and the power amplifier; and
    at least one adjustable pole element coupled between the input of the feedback loop and the power amplifier, wherein the at least one adjustable zero element and at least one adjustable pole element are operable to change the loop bandwidth of the feedback loop.

2. The feedback loop of claim 1 wherein the at least one adjustable zero element is in the forward path of the feedback loop.

3. The feedback loop of claim 1 wherein the at least one adjustable pole element is in the forward path of the feedback loop.

4. The feedback loop of claim 3 wherein the at least one adjustable zero element is in the forward path of the feedback loop, the feedback loop further comprising:
    a mixer in the forward path of the feedback loop coupled between the input of the feedback loop and the power amplifier; and
    a mixer in the feedback path of the feedback loop coupled between the output of the feedback loop and the input of the feedback loop.

5. The feedback loop of claim 4, wherein:
    the feedback loop is used as part of a radio transmitter.

6. The feedback loop of claim 1 wherein the feedback loop is a cartesian feedback loop.

7. The feedback loop of claim 1 wherein the adjustable pole element is a circuit comprising a plurality of elements having impedance that can be selectively coupled to the other elements of the circuit.

8. The feedback loop of claim 1 wherein the at least one adjustable pole element and the at least one adjustable zero element are substantially contained within an integrated circuit.

9. The feedback loop of claim 1 wherein the at least one adjustable pole element comprises two adjustable pole elements.

10. The feedback loop of claim 1 in which the adjustable zero element comprises:
    an adjustable first amplifier that amplifies an input signal to the adjustable zero element to create a first amplified signal;
    a second amplifier that amplifies the input signal to the adjustable zero element to create a second amplified signal;
    a low pass filter that operates on the first amplified signal to create a filtered amplified signal; and
    a summer to add the filtered amplified signal and the second amplified signal to create an output signal to the adjustable zero element.

11. An integrated circuit comprising the feedback loop of claim 1.

12. In a feedback loop comprising an input for receiving an input signal, an output for outputting a variable output signal, a power amplifier coupled to the output of the feedback loop in a forward path of the feedback loop, at least one adjustable zero element coupled between the input of the feedback loop and the power amplifier in the forward path of the feedback loop, and at least one adjustable pole element coupled between the input of the feedback loop and the power amplifier in the forward path of the feedback loop, a method comprising the steps of:
    generating, in the feedback loop, a loop frequency response having at least one pole and at least one zero, and a closed loop frequency response being characterized by a closed loop bandwidth; and
    moving a pole in the loop frequency response using the at least one adjustable pole element yielding a change in the closed loop frequency response.

13. The method of claim 12 wherein the step of moving a pole is accomplished by switching among a plurality of elements having different impedances.

14. The method of claim 12 further comprising the step of:
    moving a zero in the loop frequency response using the at least one adjustable zero element yielding a change in the closed loop frequency response.

15. The method of claim 14 wherein the step of moving a zero is accomplished by adjusting an amplifier with an adjustable gain.

16. The method of claim 12 wherein the power amplifier amplifies the input signal so that it can be transmitted over a radio channel.

17. A feedback loop having an input for receiving an input signal, an output for outputting a variable output signal and a loop bandwidth associated with a forward path and a feedback path of the feedback loop, the feedback loop comprising
    a power amplifier coupled to the output of the feedback loop in the forward path of the feedback loop;
    at least one adjustable zero element coupled between the input of the feedback loop and the power amplifier in the forward path of the feedback loop;
    at least one adjustable pole element coupled between the input of the feedback loop and the power amplifier in the forward path of the feedback loop;
    a first mixer in the forward path of the feedback loop coupled between the input of the feedback loop and the power amplifier; and a second mixer in the feedback path of the feedback loop coupled between the output of the feedback loop and the input of the feedback loop, wherein the at least one adjustable zero element and at least one adjustable pole element are operable to change the loop bandwidth of the feedback loop.

18. In a feedback loop comprising an input for receiving an input signal, an output for outputting a variable output signal, a power amplifier coupled to the output of the feedback loop in a forward path of the feedback loop, at least one adjustable zero element coupled between the input of the feedback loop and the power amplifier in the forward path of the feedback loop, and at least one adjustable pole element coupled between the input of the feedback loop and the power amplifier in the forward path of the feedback loop, the feedback loop further having a loop and a closed loop frequency response associated with the forward path and a feedback path of the feedback loop, the loop frequency response having at least one pole and at least one zero and the closed loop frequency response being characterized by a closed loop bandwidth, a method comprising the steps of:
- moving a pole in the loop frequency response using the at least one adjustable pole element yielding a change in the closed loop frequency response; and
- moving a zero in the loop frequency response using the at least one adjustable zero element yielding a change in the closed loop frequency response.

* * * * *

UNITED STATES PATENT AND TRADEMARK OFFICE
CERTIFICATE OF CORRECTION

| | |
|---|---|
| PATENT NO. | : 8,107,901 B2 |
| APPLICATION NO. | : 09/933364 |
| DATED | : January 31, 2012 |
| INVENTOR(S) | : Gailus et al. |

It is certified that error appears in the above-identified patent and that said Letters Patent is hereby corrected as shown below:

In Column 10, Line 56, in Claim 17, delete "comprising" and insert -- comprising: --, therefor.

Signed and Sealed this
Eighteenth Day of December, 2012

David J. Kappos
*Director of the United States Patent and Trademark Office*